United States Patent [19]

London

[11] 4,264,941
[45] Apr. 28, 1981

[54] PROTECTIVE CIRCUIT FOR INSULATED GATE FIELD EFFECT TRANSISTOR INTEGRATED CIRCUITS

[75] Inventor: Arnold London, San Jose, Calif.

[73] Assignee: National Semiconductor Corporation, Santa Clara, Calif.

[21] Appl. No.: 12,042

[22] Filed: Feb. 14, 1979

[51] Int. Cl.³ .................... H01L 27/04; H02H 9/04; H02H 7/20
[52] U.S. Cl. ........................... 361/91; 307/304; 357/13; 357/35; 357/42; 357/43; 361/56
[58] Field of Search ................... 361/56, 91, 111; 357/13, 23, 35, 41, 42, 43; 307/304; 330/298

[56] References Cited
U.S. PATENT DOCUMENTS

| 3,739,238 | 6/1973 | Hara | 357/13 |
|---|---|---|---|
| 3,787,717 | 1/1974 | Fischer et al. | 357/41 |
| 3,865,649 | 2/1975 | Beasom | 357/42 |
| 4,100,561 | 7/1978 | Ollendorf | 357/42 |
| 4,131,908 | 12/1978 | Daub et al. | 357/42 |

*Primary Examiner*—William D. Larkins
*Attorney, Agent, or Firm*—Gail W. Woodward; James A. Sheridan

[57] ABSTRACT

A protective circuit for integrated circuits having insulated gate field-effect transistors is disclosed which prevents high potentials resulting from manufacturing, installation, handling, testing or operation from damaging the gate oxide of the field-effect transistors and protective diodes associated with the input of the integrated circuit. The protective circuit includes a first vertical bipolar transistor which has its emitter-to-collector circuit connected in parallel with a first protective diode so that the anode of the diode is connected to the emitter and the input and the cathode of the diode is coupled to the collector and the drain power supply terminal of the field-effect transistors. The inherent distributed resistance of a doped region located within the substrate of the integrated circuit is coupled between the input and the base of the first bipolar transistor. A second lateral bipolar transistor, of an opposite conductivity type than the first bipolar transistor, has its emitter to collector circuit connected in parallel with a series connection of the inherent distributed resistance of the doped region and a second protective diode which is poled in an opposite orientation to the first diode with respect to the input. The cathode of the second diode is connected to the doped region's inherent resistance and the anode of the second diode is connected to the source power supply terminal. The inherent distributed resistance of the substrate of the integrated circuit is coupled between the base of the second transistor and the cathode of a low voltage reverse breakdown diode which conducts in the reverse biased direction during conduction of the second transistor. The emitter of the second bipolar transistor is connected to the input and the collector of the transistor is connected to the anode of the low voltage reverse breakdown diode and the source power supply terminal.

The application of a high potential to the integrated circuit which is of sufficient magnitude to rupture the gate oxide of the insulated gated field effect transistors causes conduction of the first or second bipolar transistors before irreversible damage of the protective diodes or the rupture of the gate oxide of the input field effect transistors of the integrated circuit can occur.

9 Claims, 6 Drawing Figures

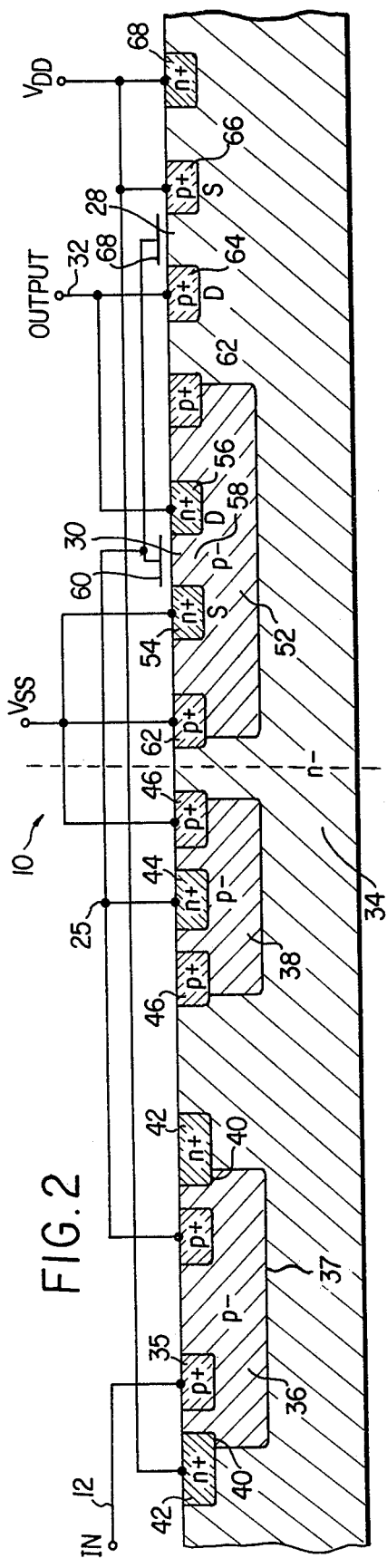
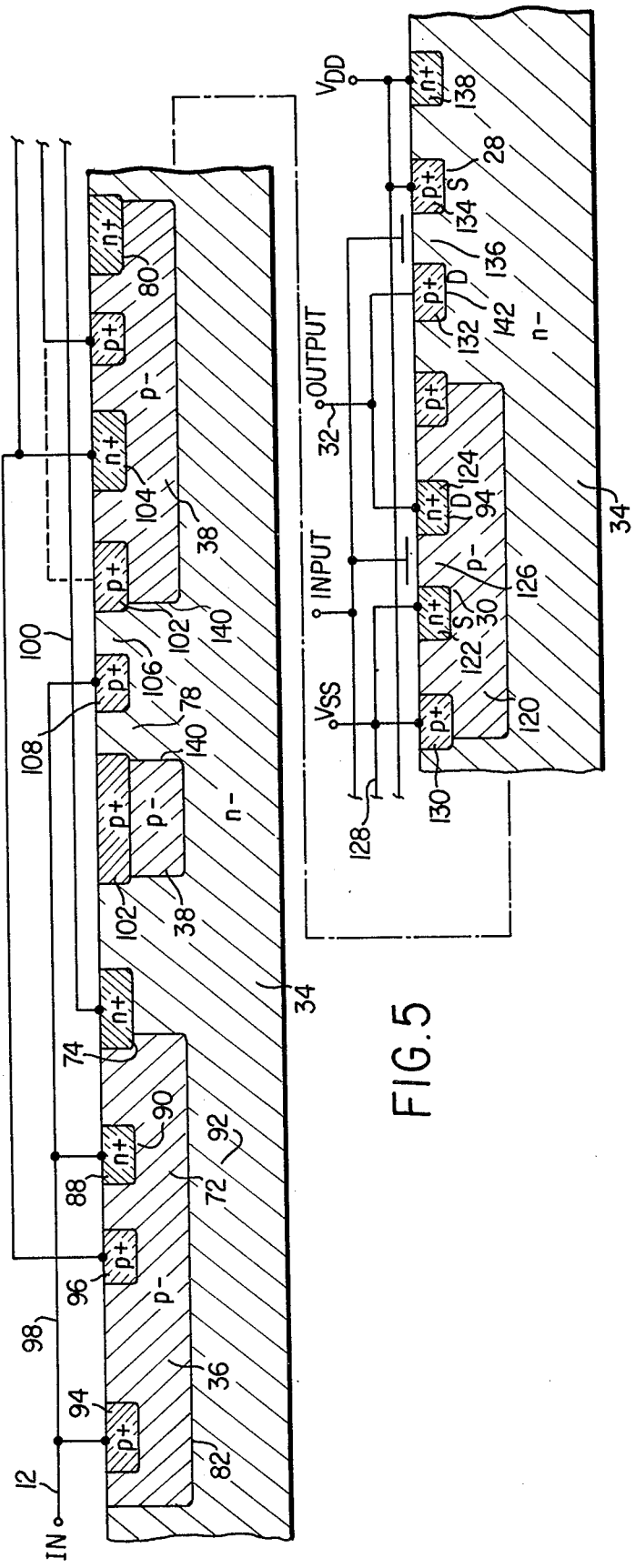

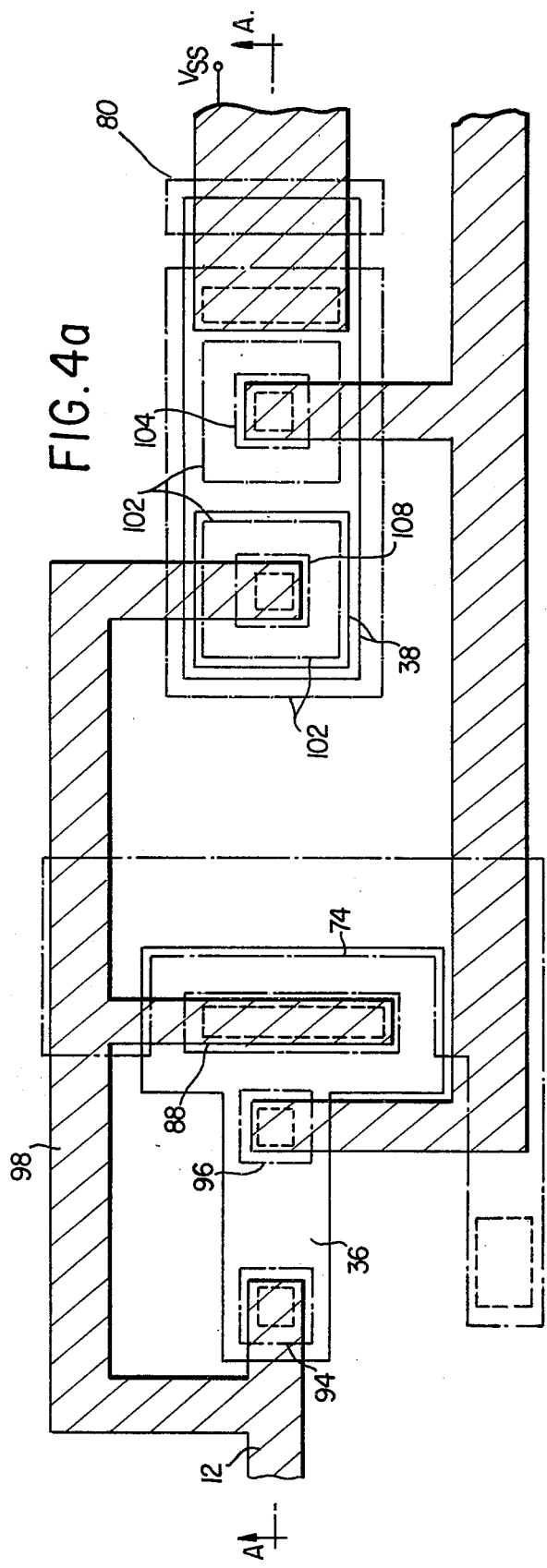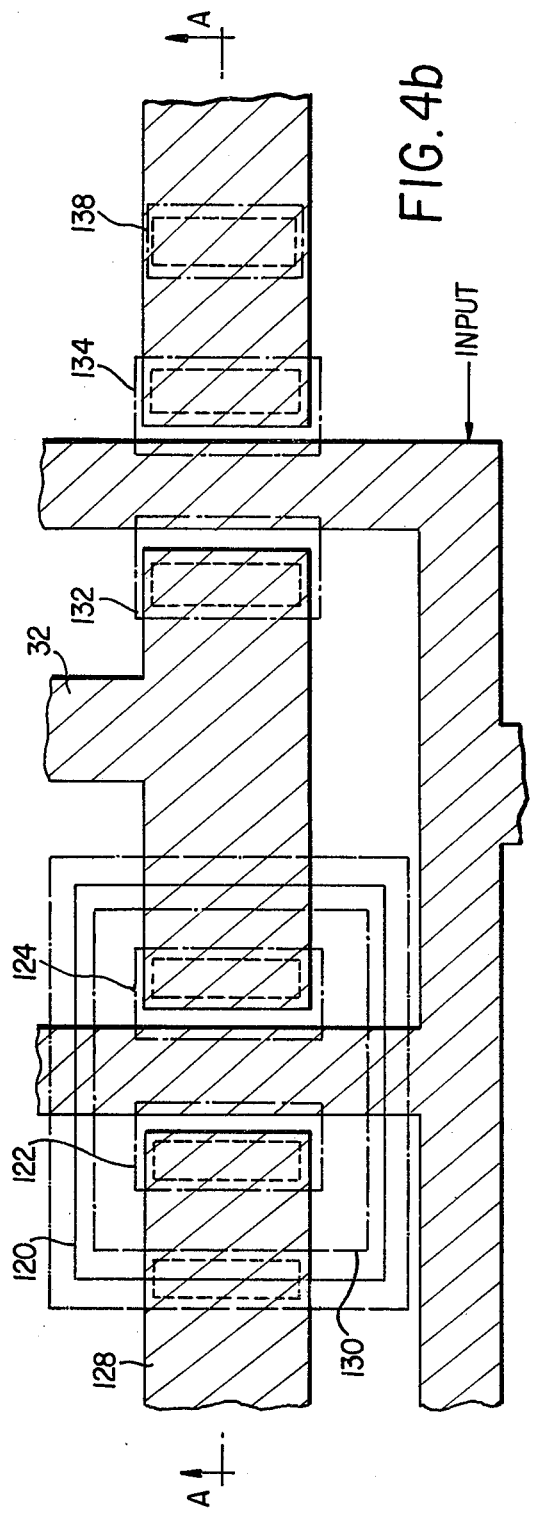

PROTECTIVE CIRCUIT FOR INSULATED GATE FIELD EFFECT TRANSISTOR INTEGRATED CIRCUITS

BACKGROUND OF THE INVENTION

1. Field of the Invention

The invention relates to protection circuits for complementary symmetry insulated gate (CMOS) field effect transistor integrated circuits. However, the invention also may be used as a protective circuit for single channel MOS field effect transistor integrated circuits.

2. Description of the Prior Art

A particular prior art protection circuit for field effect transistor integrated circuits of which the present invention is an improvement has first and second protective diodes poled with respect to the circuit input terminal so that the anode of the first diode and the cathode of the second diode are coupled to the input, the cathode of the first diode is connected to the drain power supply and the anode of the second diode is connected to the source power supply terminal. A resistance created by the anode region of the first diode exists between the input terminal and cathode of second diode which is also connected to the gate terminals of circuit input field effect transistors. This circuit protects the gate oxide of insulated gate field effect transistors from damage caused by potentials during circuit operation or testing which are applied between the input and either the output, drain power supply $V_{DD}$ or source power supply $V_{SS}$ terminals which forward bias the first or second protective diodes. Forward biasing of the protective diodes prevents the application of potentials which could damage the gate oxide of the field effect transistors. The series resistance between input terminals and gate of the input field effect transistors slows the rise of transient potentials on the gate terminal which may be applied to the circuit input terminal.

However, this circuit does not prevent damage caused by high potentials applied between the input and either the output, drain power supply or source power supply terminals which are of a sufficient magnitude to cause excessive currents to flow through the protective diodes when conducting in the avalanche breakdown mode thereby causing destruction of the protective diodes or gate oxide rupture which could destroy the integrated circuit. These potentials are typically produced by electrostatic charges which accumulate on the gate electrodes of the field effect transistors during manufacturing, handling, installation or during tests which are required by customers to simulate those conditions occurring during manufacturing, handling, installation or operation which are most likely to cause rupture of the gate oxide of the field effect transistors to permit identification of failure prone circuits.

In the prior art, two terminal tests have been developed and used by manufacturers of integrated circuits at the request of customers which apply a high potential between the input terminal of an integrated circuit and either the drain supply, source supply or output terminal to test the resistance of protective diodes to breakdown and the resistance of the gate oxide of field effect transistors against rupturing. Such tests are designed and used to simulate the actual application of high electrostatic potentials to the terminals which can occur during manufacturing, handling or installation to permit the identification of those integrated circuits in which the gate oxide would be reptured by high potentials. Such tests will be referred to in this specification as "zap" tests.

The following table identifies those zap potentials which are most likely to cause damage to the protective diodes during avalanche breakdown of the protective diodes or rupture of the gate oxide of the field effect transistors of the prior art protective circuit used to protect CMOS input devices described above. In the table a "+" represents the application of the positive terminal of a high voltage supply to the terminal of an integrated circuit identified under the heading during zap testing. Similarly, a "−" represents the application of the negative terminal of the high voltage supply to the terminal of an integrated circuit identified under the heading during zap testing. An "X" represent that the terminal under the heading is floating during zap testing.

| Test No. | $V_{in}$ | $V_{SS}$ | $V_{DD}$ | $V_{out}$ |
|---|---|---|---|---|
| 1 | + | − | x | x |
| 2 | − | x | + | x |
| 3 | + | x | x | − |
| 4 | − | x | x | + |

The potential applied during zap testing is typically produced by the discharge of a capacitor, which has been charged to values of 400 and greater volts between the terminals identified in the table described above. The severity of the zap is made greater by higher voltages applied to the capacitor and higher amounts of stored energy, $\frac{1}{2} cv^2$, stored on the discharging capacitor.

From the foregoing table, it is apparent that in zap test 1, the input terminal $V_{in}$ is connected to the positive terminal of the zap testing apparatus; the source supply terminal $V_{SS}$ is connected to the negative terminal of the zap testing apparatus and the drain supply terminal $V_{DD}$ and the output terminal $V_{out}$ are floating.

SUMMARY OF THE INVENTION

The present invention is a protective circuit for insulated gate field effect transistor integrated circuits which prevents high potentials applied between the input and either the output, drain supply or source supply terminals during manufacturing, handling, installation, operation, or zap testing from damaging the gate oxide of the insulated gate field effect transistor integrated circuits or associated protective diodes.

The protective circuit of the present invention has particular application in CMOS integrated circuits since the intrinsic CMOS structural elements give rise to the present circuit elements which include a vertical bipolar transistor with no process modifications required. However, the invention may also be used in single channel insulated gate field effect transistor integrated circuits. The present invention will be described in detail with reference to its use in CMOS integrated circuits.

A first vertical bipolar transistor is implemented in the integrated circuit so that its emitter to collector circuit is connected in parallel with a first protective diode which has its anode connected to the integrated circuit input and the emitter and the cathode of the protective diode is connected to the collector and the drain power supply terminal. The inherent distributed resistance of a doped well in which the first protective diode is fabricated in the integrated circuit substrate is connected between the input and the base of the first transistor. A diode of a predetermined low reverse avalanche breakdown potential, which must breakdown in the reverse direction to turn on the first transistor, has its cathode connected to the drain power supply terminal and its anode connected to the inherent distributed resistance of the doped well. A second lateral bipolar transistor, of a conductivity type opposite the first bipolar transistor, has its emitter to collector circuit connected in parallel with a series connection of a second protective diode and the inherent distributed resistance of the doped well. The emitter of the second transistor is connected to the input and the collector of the second transistor is connected to the anode of the second diode. The cathode of the second protective diode is connected to the distributed resistance of the doped well. A distributed resistance, which is contained within the substrate of the integrated circuit, is connected between the base of the second transistor and the cathode of a diode of a predetermined low reverse breakdown potential which must breakdown in the reverse direction to turn on the second transistor. The anode of the low reverse breakdown diode is connected to the source power supply.

Improved protection of single channel integrated circuits, such as n channel, can also be achieved by utilizing the principles of this invention. In such a case the lateral bipolar device structure could easily be used to afford increased protection for appropriate zapping conditions. No process modifications would be required.

BRIEF DESCRIPTION OF THE DRAWINGS

FIG. 2 is a cross-sectional view of the prior art circuit of FIG. 1 implemented in an integrated circuit;

FIGS. 4a and 4b are a top view of the present invention as implemented in a CMOS integrated circuit;

FIG. 5 is a cross section of the integrated circuit of FIGS. 4a and 4b taken along section line A—A.

DESCRIPTION OF THE PREFERRED EMBODIMENT

Figure 1:
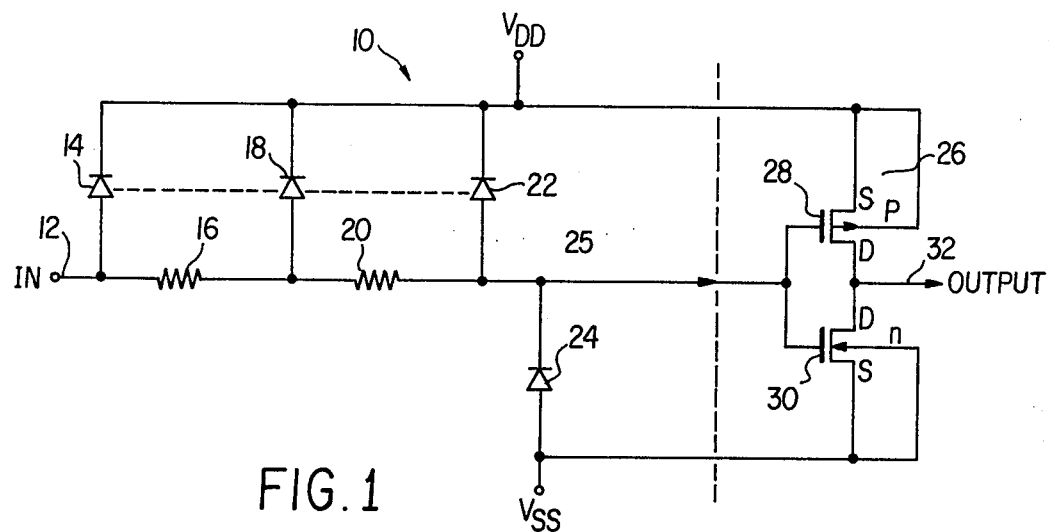
FIG. 1 is a schematic of the prior art protection circuit described above of which the present invention is an improvement.

FIG. 1 illustrates a schematic of the prior art circuit 10 of which the present invention is an improvement. The external circuit input terminal 12 is connected to the anode of a protective diode 14. A resistance 16 is connected between the anode of diode 14 and the anode of diode 18. A second resistance 20 is connected between the anode of diode 18 and the anode of diode 22. The cathodes of diodes 14, 18 and 22 are connected to the drain power supply $V_{DD}$. The anode of diode 22 and resistance 20 is connected to the cathode of diode 24. The anode of diode 24 is connected to the source power supply $V_{SS}$. The input junction 25 between the anode of diode 22 and the cathode of diode 24 is connected to the gate of a CMOS inverter 26 which consists of p and n channel type MOS field effect transistors 28 and 30 which have their source to drain circuits connected in series between the drain power supply $V_{DD}$ and the source power supply $V_{SS}$. The output terminal 32 of the single stage CMOS inverter 26 is the output to which reference is made in the zap testing described above. In multi-stage logic circuits where outputs such as 32 are connected to inputs such as 25, the final output is the one to which zap testing refers. The prior art protective circuit 10 has been used with many different types of CMOS circuits other than the single stage inverter 26. A single stage inverter 26 is illustrated to simplify the description of the prior art circuit.

FIG. 2 illustrates the implementation of the prior art circuit of FIG. 1 as an integrated circuit. Identical numerals in FIGS. 1 and 2 identify the same parts.

The integrated circuit 10 of FIG. 2 includes a n— substrate 34 into which have been made a large number of p— diffusions such as 36, 38, and 52. The inherent lateral impedance of the p— diffusion 36 is represented in FIG. 1 as the distributed resistances 16 and 20. Circuit metallization, e.g. aluminum, connects the input ohmically (in a non-rectifying manner) to the p— region 36 through the p+ diffusion 35. The p— n+ junction 40 located between the p— diffusion 36 and he n+ diffusion band 42 located within substrate 34 is diodes 14, 18 and 22 of FIG. 1. If viewed from the top, the n+42 diffusion encircles the p— diffusion 36. The circuit input 12 is connected to the p— diffusion 36 by p+ diffusion 35. The p— diffusion 36 is the anode of diodes 14, 18 and 22 and the n— diffusion and the n+ diffusion and the n+ diffusion 42 are the cathodes of diodes 14, 18 and 22. The p— n+ junction has a lower breakdown threshold than the junction 37 located between p— diffusion 36 and n— diffusion 34. The p— diffusion 38 contains diode 24, which is the junction formed by region 38 and the n+ region 44, and a p+ diffusion contact band 46 which is connected to the source potential $V_{SS}$. If viewed from the top, the p+ diffusion 46 encircles the p— diffusion 38. The anode of diode 24 is the p— diffusion 38 and the cathode is the n+ diffusion 44.

The CMOS inverter 26 also includes a p channel MOS field effect transistor 28 which is also implemented within the n— substrate by conventional integrated circuit fabrication techniques. The p channel field effect transistor includes a p+ drain 64, source 66 and gate electrode 68. The p+ drain 64 is connected to the n+ drain 56 of MOS transistor 30 and the output terminal 32. The gate 68 is connected to the gate 60 of the n channel transistor 30 and the cathode of diode 24 and distributed resistance 20. The gate electrodes 60 and 68 are positioned over a thin film of gate insulator typically silicon dioxide. It is this film, typically 1000 Å or less in thickness, which is to be protected by the previously described input circuitry. The p+ source 66 is connected to $V_{DD}$ and an n+ diffusion 68 which forms a low resistance and non-rectifying contact between $V_{DD}$ and the substrate 34.

The CMOS inverter 26 includes an n channel MOS field effect transistor 30 which is implemented in the n— substrate 34 within a p— diffusion 52 by conventional integrated circuit fabrication techniques. The n channel field effect transistor 30 includes an n+ source 54, n+ drain 56, p— channel region 58 and gate electrode 60. The $V_{SS}$ terminal is connected to the p+ diffusion 52 by a p+ diffusion 62 which forms a low resistance and nonrectifying contact between the $V_{SS}$ terminal and the p— diffusion 52. The n+ drain 56 is connected to the output terminal 32.

The prior art circuit of FIG. 2 has the disadvantage that during each of the four zap tests described above, the protective diodes of the CMOS integrated circuit will be reverse biased to breakdown by the applied zap testing potential so that junction damage could occur to the diodes due to the high current density flowing in the high electric field region of the junction region undergoing avalanche breakdown, or rupture of the gate oxide of the field effect transistors may occur due to the electric field between gate electrode and underlying substrate regions exceeding the dielectric strength of the gate oxide.

Figure 3:
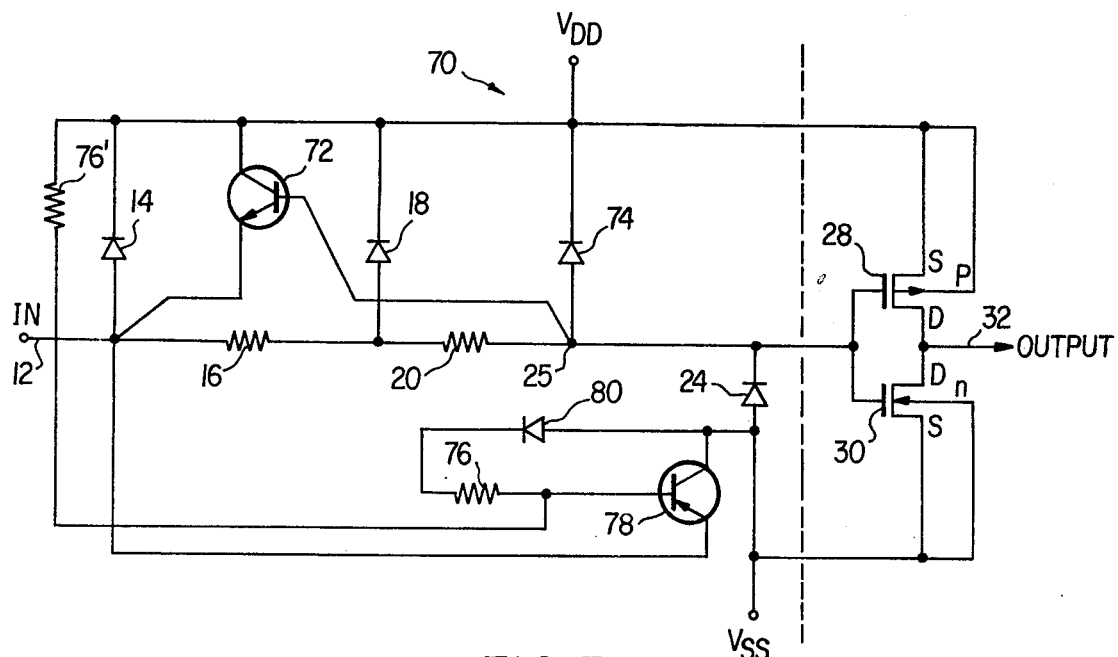
FIG. 3 is a schematic of a protective circuit in accordance with the present invention in a CMOS circuit.

FIG. 3 illustrates a schematic of an insulated gate field effect transistor protective circuit for CMOS 70 designed in accordance with the present invention. The protection diodes 14, 18 and 24 and the distributed resistances 16 and 20 of FIG. 3 are not exactly identical structurally to the corresponding parts of FIG. 1. The difference between the diodes of FIG. 1 and FIG. 3 is that in FIG. 3 there is no p− n+ junction 40.

FIG. 3 also includes an npn transistor 72 which has its emitter connected to the input 12 and anode of diode 14 and its collector connected to the cathode of diode 14, and a pnp transistor 78 which has its emitter connected to the input and its collector connected to the source power supply terminal $V_{SS}$. The emitter to collector circuit of transistor 72 provides a low impedance path between the input and the $V_{DD}$ terminal which protects the diodes 14 and 18 against high reverse potentials and the gate oxide of MOS transistors 28 and 30 against rupture. The diode 74, which has its anode connected to resistance 20 and its cathode connected to the $V_{DD}$ terminal, is designed to have a breakdown potential greater than maximum operating voltage of the circuit, typically 18 V, and less than the rupture voltage of the gate oxide, typically 60 V for a 1000 Å gate oxide. Breakdown of diode 74 is required to cause conduction of transistor 72 during zap tests 2 and 4. The reverse breakdown potential of diode 74 is chosen to cause its reverse breakdown at a potential much lower than the reverse breakdown potential of diodes 14 and 18. One way by which the low reverse breakdown potential of diode 74 may be obtained is by selective doping in accordance with well known fabrication methods. Resistances 76 and 76' are representations of inherent resistances distributed in the substrate which participate in the turn on of transistor 78 during appropriate zap conditions. The cathode of diode 24 and the anode of diode 74 are connected to CMOS input junction 25 which is connected to the gate electrodes of the MOS field effect transistors 28 and 30 of inverter 26. A diode 80 having a predetermined low reverse potential breakdown identical to diode 74 is required to cause conduction of transistor 78 at a sufficiently short time after discharge begins during zap tests 1 and 3. The anode of diode 80 is connected to the collector of transistor 78. The resistance 76 is connected between the base and the cathode of diode 80. The resistance 76' is connected between the base of transistor 78 and the cathode of diode 14. The drains of field effect transistors 28 and 30 are connected to the CMOS output terminal 32.

The diodes 74 and 80 are means for biasing the transistors 72 and 78 into conduction when a potential of a predetermined magnitude is applied between the input terminal and one of the other terminals.

The operation of the protective circuit of FIGS. 4a, 4b and 5 for zap tests 1-4 is summarized as follows:

During zap test 1, lateral transistor 78 is turned on by the forward biasing of the emitter-base junction which is caused by current flow from the input terminal 12 through the emitter of transistor 78, resistance 76, reverse biased diode 80 to the $V_{SS}$ terminal and the reverse biasing of the base-collector junction which is caused by the base being at a higher potential than the source supply $V_{SS}$. An additional forward biasing effect on the emitter-base junction of transistor 78 arises from current flowing through diode 14, resistors 76' and 76 and reverse biased diode 80. Current flowing through resistor 76' causes the base terminal of transistor 78 to be at a more negative potential than the cathode of diode 14 and enhances the turn on of transistor 78.

The turning on of transistor 78 during zap test 1 creates an additional path for the flow of zap discharge current, resulting in less current flowing through diode 24 during breakdown and lower electric fields across the gate oxide of MOS field effect transistors 28 and 30.

During zap test 2, vertical transistor 72 is turned on by the forward biasing of the base to emitter junction which is caused by current flow from the drain supply $V_{DD}$ through a reverse biased diode 74 of low reverse breakdown threshold, resistances 16 and 20 to the input terminal 12 and the reverse biasing of the base-collector junction which is caused by the collector being at a higher potential than the base because the collector is coupled to the substrate 34 (FIG. 5).

The turning on of transistor 72 during zap test 2 creates an additional path for zap discharge current flow, resulting in lower currents flowing through reverse biased junctions in avalanche breakdown than in the prior art and resulting also in lower electric fields appearing across the gate oxides of transistors 28 and 30.

During zap test 3, current flow is from input terminals 12 to the output terminal 32. Current conduction from the input to the output occurs during zap test 3 because of the conduction of a p− n+ junction 94 (FIG. 5) located between the n+ drain 128 of transistor 30 and the $V_{SS}$ terminal. Transistor 78 is turned on by the forward biasing of the base-emitter junction which is caused by current flow from input terminal 12, through the emitter 108 in parallel with the series combination of diode 14 and substrate resistances 76', and 76, and reverse biased diode 80 to the source supply terminal $V_{SS}$ and from $V_{SS}$ to the forward biased p− n+ junction 94 of output transistor 30 to the output terminal 32 and the reverse biasing of the base-collector junction which is caused by the base remaining approximately one forward diode potential drop (~0.7 V) below positively rising input terminal 12 potential while $V_{SS}$ remains at a more negative value. The turning on of transistor 78 in zap test 3 is similar to zap test 1 since current flow in both tests occurs from the input to the $V_{SS}$ terminal, which is necessary to turn on transistor 78.

During zap test 4, current flow is from output terminal 32 to terminal 12. Current conduction from the output to the input occurs during zap test 4 because of the conduction of a forward biased p+ n− junction 96 (FIG. 5) located between a p+ drain of output transistor 28 and the $V_{DD}$ terminal.

Transistor 72 is turned on by the forward biasing of the base-emitter junction which is caused by current flow from the output through p+ n− junction 96, the substrate 34 which is resistively coupled to $V_{DD}$ and from $V_{DD}$ through reverse biased diode 74, resistances 16 and 20 to the input 12 and the reverse biasing of the base-collector junction which is caused by the collector being at a higher potential than the base due to the collector being coupled to the substrate 34 (FIG. 5). The turning on of transistor 72 in zap test 4 is similar to zap test 2 since current flow in both tests occurs from the $V_{DD}$ terminal to the input terminal, which is necessary to turn on transistor 72.

FIGS. 4a, 4b and 5 illustrate a CMOS integrated circuit implementing the present invention. FIG. 5 is a cross-sectional view of FIGS. 4a and 4b which is taken along section line A—A.

The n− substrate 34 includes a p− diffusion 36 in which is formed the protective diodes 14 and 18 and the low reverse breakdown diode 74, and distributed resistances 16 and 20 of FIG. 3. The level of doping at the surface of the p− diffusion 36 is typically near $10^{16}$ cm$^{-3}$. The diodes 14 and 18 are implemented as the p− n− junction 82 at the interface of the p− diffusion 36 and the n− substrate 34. The inherent impedance of diffusion 36 functions the resistances 16 and 20 of FIG. 3.

Diode 74, consisting of a p− n+ junction having the predetermined low reverse breakdown potential described above, is formed at the right hand side of the p− diffusion 36 at a point displaced the maximum distance from the input 12. The breakdown potential of this junction is determined primarily by the maximum acceptor ion concentration near the surface of the p− region. For a concentration of $10^{16}$ cm$^{-3}$, a breakdown voltage of about 45 V is obtained. Other well known techniques for obtaining a sufficiently low breakdown voltage at this region of the junction, such as overlapping the junction with a metal electrode maintained at the potential of the p− region, might alternatively be employed. The p− n+ junction 74 permits current flow from the $V_{DD}$ terminal through the inherent resistance 16 and 20 of diffusion 36 to the input 12 during zap tests 2 and 4 which turns on transistor 72.

The p− diffusion 36 and the portion of the substrate 34 directly below the diffusion 36 function as the vertical npn transistor 72. The p− diffusion 90 in the proximity of the n+ emitter 88 is the base of vertical transistor 72. The region 92 in the p− substrate 34 directly below the base 90 is the collector of vertical transistor 72. The base will typically have a width of approximately 5 microns which, combined with an acceptor concentration of less than $10^{16}$ cm$^{-3}$ and high lifetime processing, yields a high beta ($h_{FE}$) of approximately 100 or more.

The p+ input contact 94 and the p+ contact 96 should be doped to approximately $10^{20}$ cm$^{-3}$.

The input terminal 12 is connected directly to the emitter 88 by metallization 98 and the n+ diffusion of diode 74 is connected to the drain supply $V_{DD}$ by metallization 100.

The n− substrate 34 includes a p− diffusion 38 in which is formed the protective diode 24 and the bottom region of the collector 102 of lateral transistor 78. Viewed from the top, the collector 102 is a closed loop. It is defined at the silicon surface by a p+ diffused region 102. The diode 24 is the p− n+ junction 104.

A p+ diffusion 108 is the emitter of lateral transistor 78. The area 106 of the n− substrate 34 which is contained between the collector 102 and emitter 108 is the base of lateral pnp transistor 78. The emitter 88 of transistor 72 and the emitter 108 of transistor 78 are connected to the input 12 by metallization 98. The extended depth of the collector region created by p− region 38 improves the collection efficiency of transistor 78.

The base width measured between the collector 102 and emitter 108 should be from 2-5 microns which yields a beta of approximately 1-10.

The product of the betas of the vertical transistor 72 and a parasitic lateral transistor formed by p+ region 132 as emitter, n− substrate region 34 as base, and p−
region 36 as collector, can be designed to be greater than unity so that they function as a Shockley diode during zap test 4. When the vertical transistor 72 and the parasitic lateral transistor function as a Shockley diode, a low voltage-high current conducting characteristic is obtained during zap testing, which provides additional protection to protective diodes 14, 18 and 24 and the gate oxide of the field effect transistors 28 and 30 than occurs when transistor 72 is conductive.

Diode 80, consisting of a p− n+ junction having a predetermined low breakdown reverse potential equal to that of diode 74, discussed above, is formed in the side of the p− diffusion 38 located closest to the output 32. The diode 80 has a construction identical to diode 74. The low reverse breakdown of diode 80 causes current flow in zap tests 1 and 3 from $V_{in}$, through emitter 108 and diode 14, the inherent resistances of the substrate 76 and 76' and diode 80 to $V_{SS}$ which turns on transistor 78.

Current flow in zap tests 1 and 3 initially occurs through resistors 16 and 20 and diode 24 which is driven into avalanche breakdown. It has a breakdown voltage approximately equal to that of diode 80. when potential drop across resistances 16 and 20 reaches about 0.7 volts current flow through transistor 78 will begin to dominate. For the case when the combined resistance of resistances 16 and 20 is approximately equal to 1.4 K ohms, this should occur at the low value of discharge current of 0.5 MA. The same type of performance is the case for the turning on of transistor 72.

FIGS. 4a, 4b and 5 also illustrate a single stage CMOS inverter 26 which has been fabricated in the substrate 34 as a p channel MOS field effect transistor 28 and an n channel field effect transistor 30. In FIGS. 4a and 4b, the p+ regions are identified by 94, 96, 102, 108, 130, 132 and 134 and the n+ regions are identified by 74, 80, 88, 104, 122, 124 and 138. The inverter is of conventional design and is illustrated and discussed only for the purpose of explanation of the current paths which exist between the input terminal 12 and output terminal 32 in the substrate 34 during zap tests 3 and 4. The n channel transistor 30 is formed with a p− diffusion 120 which has been formed in the n− substrate 34. The n+ source 122, n+ drain 124 and p− channel region 126 of the n channel transistor 30 have been fabricated by conventional integrated circuit fabrication techniques. The source supply terminal $V_{SS}$ is connected to the protective circuit illustrated to the left of the inverter 26 by metallization 128. The source terminal $V_{SS}$ is connected to the p− diffusion 120 by a p+ diffusion 130 which surrounds the p− diffusion. The p channel transistor 28, having a p+ drain 132, p+ source 134 and n− channel region 136 of transistor 28 are formed within the n− substrate 34 by conventional integrated circuit fabrication techniques. The drain terminal $V_{DD}$ of transistor 28 is connected to output terminal 32. The source terminal 134 of transistor 28 is connected to the n− substrate 34 by a n+ diffusion 138.

During zap tests 3 and 4, junction 94 or 142 respectively will be forward biased. This provides a low resistance path from output terminal 32 to permit input protection circuitry to operate as described for zap tests 1 and 2.

During zap test 1, current flows from the input 12 to the $V_{SS}$ terminal through a current path which includes the turned on lateral transistor 78. The current flow through lateral transistor 78 reduces the amount of current which would otherwise flow through protective diode 24 conducting in the avalanche breakdown mode. This reduces localized heating effects in the diode junction region which could result in permanent damage to the diode and it reduces IR voltage drop across the bulk resistance of diode 24 which decreases the likelihood of gate oxide rupture. Current flow from the input to the $V_{SS}$ terminal which turns on transistor 78 is caused by the reverse biasing of the low reverse breakdown p− n+ junction 80 to breakdown. Means other than the p− n+ junction may be used to achieve breakdown voltage below the value required for oxide rupture. During zap test 1, current initially flows from the emitter 108 through the substrate 34 to the n+ diffusion of p− n+ junction 80 and to the $V_{SS}$ terminal. Current also flows through p− resistance 36 and diode junction 104 to $V_{SS}$ when potential greater than that required to cause avalanche breakdown of 104 is achieved. The n− substrate region will rise in potential during zap test 1 to remain one forward biased diode voltage drop (approximately 0.7 V) below the input potential appearing at p+ regions 94 and 108. When the voltage drop across resistances 16 and 20, caused by current flowing through these regions and diode 24 to $V_{SS}$, reaches approximately 0.7 V, the left hand end of p− n+ junction 82 will begin to inject current into n− substrate region 34. This current will flow to $V_{SS}$ either through reverse biased junction 80 conducting in the avalanche breakdown mode, or through pn junction 140 if injected holes from pn junction 82 can diffuse this distance in substrate 34 prior to recombination. By designing resistances 76′ and 76 to be comparable or lower in value than resistances 16 and 20, a large portion of discharge current during zap test 1 will tend to flow through the path including diode 80 to $V_{SS}$. As current flow through resistance 76′ increases, the n− region 106 beneath p+ region 108 will become more negative in potential than the n− region at junction 82. This will cause transistor 78 to conduct more current by injecting holes from region 108 which are collected by reverse biased junction 140. The significant collecting regions of junction 140 consist of the inner region of p+ region 102 surrounding 108 along with the underlying junction region formed by p− region 38. The conduction of transistor 78 during zap test 1 provides and additional path for the flow of a substantial portion of discharge current, thus lessening current density through diode 24. Therefore, during zap test 1, current density through reverse biased diode 24 is lowered and potentials applied across the gate oxide of the CMOS circuit are lowered.

During zap test 2, current flows from the $V_{DD}$ terminal to the input 12 through a current path which includes the turned on vertical transistor 72. Current flow through vertical transistor 72 reduces current density through reverse biased diodes 14 and 18 which could destroy their junctions. It also reduces the potential buildup across their series resistances, thus reducing the likelihood of rupturing the gate oxide of the CMOS circuit. Current flow from the $V_{DD}$ terminal to the input 12, which turns on vertical transistor 72, is the result of the reverse biasing of the low reverse breakdown p− n+ junction 74 to breakdown. The current flowing through transistor 72 will be approximately beta of transistor 72 times the breakdown current flowing through junction 74.

During zap test 2, current flows from $V_{DD}$, through the low threshold reverse breakdown p− n+ junction 74, completely across the distributed resistances 16 and 20 of the p− diffusion 36 to the low resistance input contact 12. The voltage drop across the distributed resistance 16 and 20 of the p− diffusion 36 causes the base region 90 of the vertical transistor, which is directly below the emitter 88, to be biased positive with respect to the emitter to thereby forward bias the emitter-base junction. The connection of the n+ diffusion of diode 74 directly to $V_{DD}$ causes the collector 92 of transistor 72 to be biased positive with respect to the base 90 in view of the reverse breakdown voltage drop across diode 74 from $V_{DD}$ to the base thereby reverse biasing the base-collector junction. The n+ region 74 is made to closely surround emitter region 88 as much as possible to lower the series resistance of 72 and reduce excessive potentials from appearing across gate oxides in the CMOS circuit.

During zap test 3, current flows from the input 12 to the output 32. The current flow in zap test 3 is closely related to the current flow in zap test 1. In both zap tests 1 and 3, current flows from the input to the $V_{SS}$ terminal which causes the conduction of lateral transistor 78. In addition in zap test 3, current flow includes flow from $V_{SS}$ through the p+ diffusion 130, through the p− diffusion 120 across p− n+ junction 94 at the interface of the p− diffusion and n+ drain 124 to the output terminal 32.

During zap test 4, current flows from the output 32 to the input 12. The current flow in zap test 4 is closely related to the current flow in zap test 2. In both zap tests 2 and 4, currents flows from the $V_{DD}$ terminal to the input terminal 12. In addition in zap test 4, current flows from the output terminal 32, through p+ n− junction 96, substrate 34, n+ diffusion 138 to the $V_{DD}$ terminal.

The fabrication of a protective circuit in accordance with the invention may be accomplished by any technique for fabricating integrated circuits.

While the operation of a protection circuit in accordance with the present invention has been explained with reference to CMOS integrated circuits, the invention is also applicable to single channel n or p type integrated circuits. When used with single channel integrated circuits, only half of the CMOS protective circuit described above is generally available, namely that half containing the lateral bipolar transistor. This may be used to provide improved resistance to two terminal zap testing for appropriate biasing conditions.

What is claimed is:

1. A protective circuit for CMOS integrated circuits having a substrate of a first conductivity type, one or more diffusions contained within the substrate which are of conductivity type opposite the substrate in which are formed one or more MOS transistors of the same channel type as the conductivity of the substrate and one or more MOS transistors formed within the substrate of a channel type opposite the conductivity type of the substrate comprising:
 (a) an input and an output terminal;
 (b) a terminal adapted to be connected to a first operating potential;
 (c) a terminal adapted to be connected to a second operating potential;
 (d) a first diode having a first and second electrode, the first electrode being coupled to the input terminal and the second electrode being coupled to the terminal which is adapted to be connected to the first operating potential;
 (e) a second diode having a first and a second electrode, the first electrode being coupled to the terminal adapted to be connected to the second operating potential and the second terminal being coupled to the input terminal;

(f) a first transistor having a base and an emitter and a collector coupled between the first electrode of the first diode and the second electrode of the first diode, the collector being located in the substrate, the base being a diffusion located within the substrate of a conductivity type opposite the conductivity type of the substrate and the emitter being a diffusion of a conductivity type the same as the substrate which is contained within the base diffusion;

(g) means coupled to the base of the first transistor for biasing the transistor into conduction when a potential is applied between the input and one of the other terminals which is of sufficient magnitude to reverse bias the first diode to a predetermined potential;

(h) a second transistor having a base and an emitter and a collector coupled between the input and the first electrode of the second diode, the emitter being a diffusion of a conductivity type opposite the conductivity type of the substrate, the base being contained within the substrate and the collector being a diffusion of a conductivity type opposite the conductivity type of the substrate; and (i) means coupled to the base of the second transistor for biasing the transistor into conduction when a potential is applied between the input and one of the other terminals of sufficient magnitude to reverse bias the second diode to a predetermined potential.

2. The protective circuit of claim 1 wherein the collector of the second transistor surrounds the emitter and the base of the second transistor.

3. A protective circuit in accordance with claim 1 wherein:

(a) the means for biasing the first transistor into conduction comprises a first resistance coupled between the input and the base of the first transistor and a third diode having a first electrode coupled to the first resistance and a second electrode coupled to the terminal which is adapted to be connected to the first operating potential, the third diode having a reverse breakdown potential which is less than the reverse breakdown potential of the first diode; and (b) the means for biasing the second transistor into conduction comprises a second resistance coupled to the base of the second transistor and to a fourth diode having a first electrode coupled to the collector of the second transistor and a second electrode coupled to the base of the second transistor, the fourth diode having a reverse breakdown potential which is less than the reverse breakdown potential of the second diode.

4. The protective circuit of claim 3 wherein the first and second transistors are respectively of opposite conductivity type.

5. The protective circuit of claim 4 wherein the first electrode of the first and third diodes and the second electrode of the second diode is coupled to the input of the CMOS field effect transistor circuit.

6. The protective circuit of claim 5 wherein the first operating potential is p channel source power supply and the second operating potential is the n channel source power supply.

7. The protective circuit of claim 4 further comprising:

(a) substrate of semiconductor material of a first conductivity type;

(b) a first doped region of a second conductivity contained within the substrate, the first and third diodes and the first transistor being fabricated partially within the first region;

(c) means connecting the input to the first region, the third diode being partially disposed within the first region at a point farthest from the part of the first diode disposed within the first region; and (d) a second doped region of the second conductivity type contained within the substrate, the second and fourth diodes and the second transistor being fabricated partially within the second region, the fourth diode being partially disposed with the second region at a point farthest from the part of the second transistor fabricated within the second region.

8. The protective circuit of claim 7 wherein the first transistor is fabricated vertically within the first region and the substrate and the second transistor is fabricated laterally within the substrate and the second region.

9. The protective circuit of claim 7 wherein:

(a) the first resistance is contained within the first region;

(b) the second resistance is contained within the substrate between the base of the second transistor, the second electrode of the fourth diode, and the second electrode of the first diode.

* * * * *